(12) United States Patent
Maeda et al.

(10) Patent No.: US 8,195,697 B2
(45) Date of Patent: Jun. 5, 2012

(54) DATABASE CREATION METHOD, DATABASE DEVICE AND DESIGN DATA EVALUATION METHOD

(75) Inventors: Shimon Maeda, Tokyo (JP); Noriyuki Honda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 573 days.

(21) Appl. No.: 12/354,594

(22) Filed: Jan. 15, 2009

(65) Prior Publication Data

US 2009/0187590 A1  Jul. 23, 2009

(30) Foreign Application Priority Data

Jan. 16, 2008  (JP) ................................. 2008-007165

(51) Int. Cl.
*G06F 7/00* (2006.01)
(52) U.S. Cl. ........ 707/793; 707/796; 707/899; 716/104; 716/111; 716/136; 716/139
(58) Field of Classification Search .................. None
See application file for complete search history.

(56) References Cited

U.S. PATENT DOCUMENTS

| | | | |
|---|---|---|---|
| 6,470,489 B1 | 10/2002 | Chang et al. | |
| 6,836,877 B1 * | 12/2004 | Dupenloup | 716/103 |
| 7,065,724 B2 * | 6/2006 | Caty et al. | 716/103 |
| 7,356,788 B2 | 4/2008 | Chang et al. | |
| 7,392,503 B2 | 6/2008 | Wang | |
| 2001/0018758 A1 * | 8/2001 | Tanaka et al. | 716/6 |

FOREIGN PATENT DOCUMENTS

| | | |
|---|---|---|
| JP | 4-7674 | 1/1992 |
| JP | 6-268069 | 9/1994 |
| JP | 07-311797 | 11/1995 |
| JP | 2000-057188 | 2/2000 |
| JP | 2003-243510 | 8/2003 |
| JP | 2003-526110 | 9/2003 |
| JP | 2004-54689 | 2/2004 |
| JP | 2005-107883 | 4/2005 |
| JP | 2007-12687 | 1/2007 |
| JP | 2007-102420 | 4/2007 |

OTHER PUBLICATIONS

Notice of Reasons for Rejection, issued by Japanese Patent Office, dated Sep. 27, 2011, in a Japanese patent application No. 2008-007165, 4 pages.
Notice of Reasons for Rejection mailed Feb. 3, 2012, from the Japanese Patent Office for counterpart Japanese Patent Application No. 2008-007165 (5 pages).

* cited by examiner

*Primary Examiner* — Tim T Vo
*Assistant Examiner* — Anh Tai Tran
(74) *Attorney, Agent, or Firm* — Finnegan, Henderson, Farabow, Garrett & Dunner, L.L.P.

(57) ABSTRACT

A database creation method relating to semiconductor ICs, the database registering function block cells constituting a design data of semiconductor IC and evaluation values corresponding to the function block cells such that the function block cells are associated with the evaluation values, for each of the semiconductor ICs, the creation method includes judging whether or not that function block cells constituting a design data of desired semiconductor IC include an unregistered function block cell which is not registered in the database, calculating an unregistered evaluation value corresponding to the unregistered function block cell when the function block cells constituting the design data of the desired semiconductor IC are judged to include the unregistered function block cell, and updating the database by registering the unregistered function block cell and the unregistered evaluation value such that the unregistered function block cell is associated with the unregistered evaluation value.

10 Claims, 10 Drawing Sheets

DATABASE CREATION METHOD, DATABASE DEVICE AND DESIGN DATA EVALUATION METHOD

CROSS-REFERENCE TO RELATED APPLICATIONS

This application is based upon and claims the benefit of priority from prior Japanese Patent Application No. 2008-007165, filed Jan. 16, 2008, the entire contents of which are incorporated herein by reference.

BACKGROUND OF THE INVENTION

1. Field of the Invention

Present invention relates to a method for creating database in which data relating to design data of semiconductor device is entered, a database device and a design data evaluation method.

2. Description of the Related Art

Conventionally, design data of semiconductor integrated circuits is evaluated as follows (U.S. Pat. No. 6,470,489). That is, one product is selected from n pieces of products and an optical proximity effect correction (OPC) is applied to design data of the selected product (first step), an OPC verification value of the design data subjected to the OPC is calculated (second step), and the design data subjected to the OPC is evaluated based on the OPC verification value (third step). Thereafter, the first to third steps are similarly performed for the each of the remaining products.

The amount of design data of semiconductor integrated circuits is extremely large. Therefore, the above method requires relatively long time to evaluate the design data.

BRIEF SUMMARY OF THE INVENTION

According to an aspect of the present invention, there is provided a creation method for database relating to a plurality of semiconductor integrated circuits, the database registering a plurality of function block cells constituting a design data of semiconductor integrated circuit and a plurality of evaluation values corresponding to the plurality of function block cells such that the plurality of function block cells are associated with the plurality of evaluation values, for each of the plurality of semiconductor integrated circuits, the creation method comprising: judging whether or not that a plurality of function block cells constituting a design data of desired semiconductor integrated circuit include an unregistered function block cell which is not registered in the database; calculating an unregistered evaluation value corresponding to the unregistered function block cell in a case where the plurality of function block cells constituting the design data of the desired semiconductor integrated circuit are judged to include the unregistered function block cell; and updating the database by registering the unregistered function block cell and the unregistered evaluation value such that the unregistered function block cell is associated with the unregistered evaluation value.

According to an aspect of the present invention, there is provided a database device comprising: a database relating to a plurality of semiconductor integrated circuits, the database registering a plurality of function block cells constituting a design data of semiconductor integrated circuit and a plurality of evaluation values corresponding to the plurality of function block cells such that the plurality of function block cells are associated with the plurality of evaluation values, for each of the plurality of semiconductor integrated circuits; a judging unit configured to judge whether or not that a plurality of function block cells constituting a design data of desired semiconductor integrated circuit include an unregistered function block cell which is not registered in the database; a calculating unit configured to calculate an unregistered evaluation value corresponding to the unregistered function block cell in a case where the plurality of function block cells constituting the design data of the desired semiconductor integrated circuit are judged to include the unregistered function block cell by the judging unit; and an updating unit configured to update the database by registering the unregistered function block cell and the unregistered evaluation value such that the unregistered function block cell is associated with the unregistered evaluation value.

According to an aspect of the present invention, there is provided a method for evaluating design data comprising: preparing a database relating to a plurality of semiconductor integrated circuits, the database registering a plurality of function block cells constituting a design data of semiconductor integrated circuit and a plurality of evaluation values corresponding to the plurality of function block cells such that the plurality of function block cells are associated with the plurality of evaluation values, for each of the plurality of semiconductor integrated circuits; extracting a plurality of evaluation values from the database, wherein the plurality of evaluation values are associated with a plurality of function block cells of a desired semiconductor integrated circuit in the plurality of semiconductor integrated circuits; and judging whether or not the design data of the desired semiconductor integrated circuit is acceptable or rejectable based on the extracted plurality of evaluation values.

DETAILED DESCRIPTION OF THE INVENTION

There will now be described embodiments of the present invention with reference to the accompanying drawings.

First Embodiment

Figure 1:
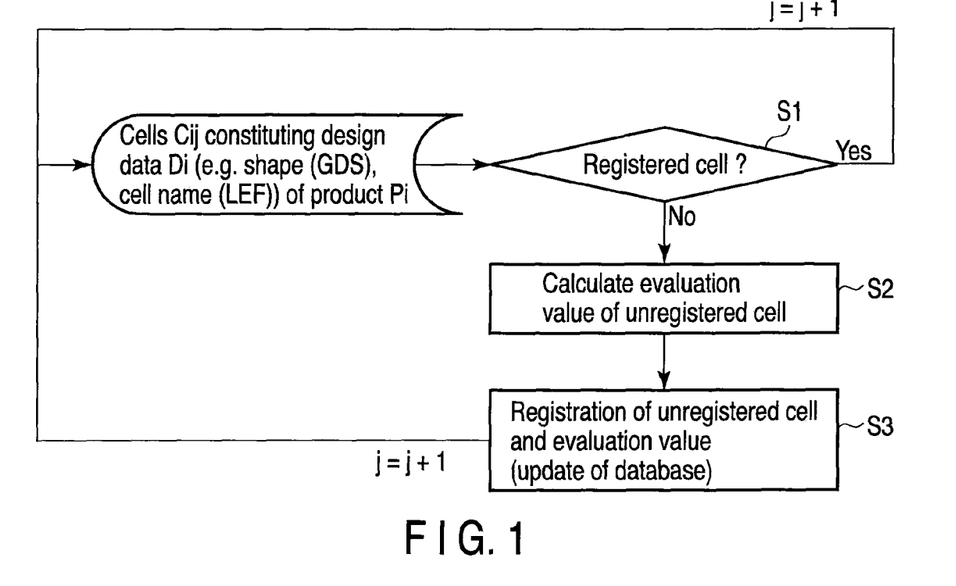
FIG. 1 is a flowchart for illustrating a database creation method according to a first embodiment of the present invention.

FIG. 1 is a flowchart for illustrating a database creation method according to a first embodiment of the present invention. The present embodiment relates to a database creation method of a plurality of semiconductor integrated circuits. This database registers a plurality of function block cells (hereinafter simply referred to as cells) constituting a design data of semiconductor integrated circuit and a plurality of evaluation values corresponding to the plurality of cells such that the plurality of cells are associated with the plurality of evaluation values, for each of the plurality of semiconductor integrated circuits.

The database creation method of the present embodiment includes step S1 for judging whether a plurality of cells Cij (j=1, 2, . . . ) constituting design data Di of a desired semiconductor integrated circuit in a product Pi (i=1, 2, . . . ) are registered or not registered in a database 4, step S2 for calculating an evaluation value (unregistered evaluation value) of a cell (unregistered cell) which is not registered in the database in a case where the plurality of cells Cij constituting the design data Di includes the unregistered cell, and step S3 for updating the database by registering the unregistered cell and the unregistered evaluation value such that the unregistered cell is associated with the unregistered evaluation value.

The design data Di of the semiconductor integrated circuit contains GDS and LEF (library-exchange format).

The cell is a cell to perform a basic logical operation such as an AND, OR or NOT operation or a cell constructed by a plurality of basic logical operation to perform a predetermined logical function operation.

Information containing a shape and cell name of the unregistered cell and the evaluation value thereof corresponding thereto are registered in the database 4. Information associated with the shape of the cell is contained in GDS. Information associated with the cell name is contained in LEF. The shape may contain the dimension (size) in some cases.

Steps S1 to S3 are performed for all of the cells Cij. But, steps S2, S3 are performed only for the unregistered cells.

Specifically, one cell is extracted from a plurality of cells associated with a first-layered pattern constituting the semiconductor integrated circuit and step S1 is performed for the extracted cell. If the cell is an unregistered cell, steps S2, S3 are further performed. The above flow is also performed for a plurality of cells associated with the remaining first-layered patterns. The same flow is performed for the patterns of the remaining layers. It is also possible to extract cells for respective layer names (for example, POLY, Metal) constituting the semiconductor integrated circuit.

As will be described later, the evaluation value is typically a verification result of optical proximity effect correction (OPC), a verification result of process proximity correction (PPC) or CA value.

In addition, since none of the Cij is registered in the database at the start time of database creation, the result of determination in step S1 becomes NO (unregistered).

Figure 2:
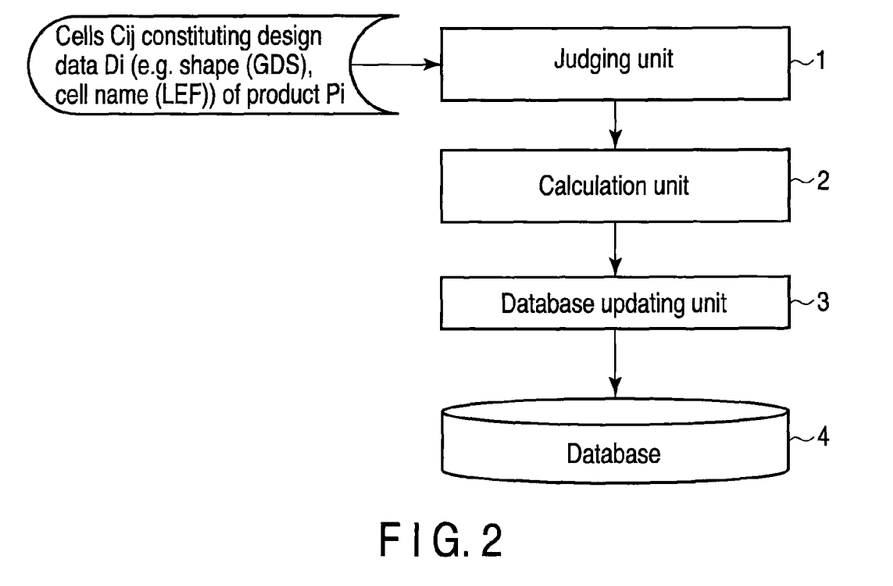
FIG. 2 is a schematic diagram showing a database device used to perform the database creation method according to the first embodiment.

FIG. 2 is a schematic diagram showing a database device used to perform the database creation method of the present embodiment.

The database device of the present embodiment includes a database 4 relating to a plurality of semiconductor integrated circuits, the database 4 registering a plurality cells constituting a design data of semiconductor integrated circuit and a plurality of evaluation values corresponding to the plurality of cells such that the plurality of cells are associated with the plurality of evaluation values, for each of the plurality of semiconductor integrated circuits, a judging unit 1 configured to judge whether a plurality of cells Cij (j=1, 2, . . . ) constituting design data Di of a desired semiconductor integrated circuit in a product Pi (i=1, 2, . . . ) are registered or not registered in the database 4, a calculating unit 2 configured to calculates an evaluation value (unregistered evaluation value) of a cell (unregistered cell) which is not registered in the database in a case where the plurality of cells Cij constituting the design data Di are judged to include the unregistered cell by the judging unit 1; and a database updating unit 3 configured to update the database 4 by registering the unregistered cell and the evaluation value such that the unregistered cell is associated with the unregistered evaluation value.

There is a possibility that the same cell lies in the cells Cij constituting the design data Di of the semiconductor integrated circuit in the product Pi and a plurality of cells Clm constituting design data Dk of a semiconductor integrated circuit in a product Pk different from the product Pi. In the case of the present embodiment, the evaluation (step S2) for the same cell as the already registered cell is not performed. As a result, since the evaluation (repeated evaluation) for the same cell is not repeatedly performed if the same cell lies in the different products, an increase in time required for database creation can be suppressed.

In addition, in the present embodiment, a case of the design data Di of the desired semiconductor integrated circuit in the product Pi (i=1, 2, . . . ) is explained, the database creation method and database device of the present embodiment can be used for design data of a desired semiconductor integrated circuit that is not associated with a product (product name) (this applies to the other embodiments).

Second Embodiment

Figure 3:
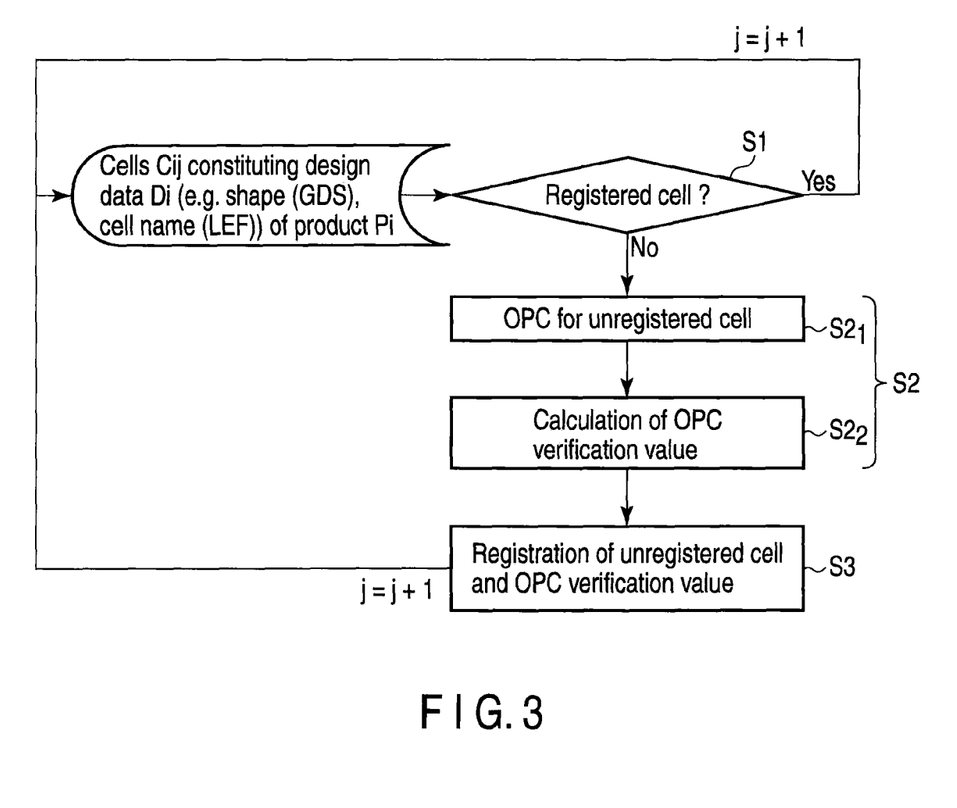
FIG. 3 is a flowchart for illustrating a database creation method according to a second embodiment of the present invention.

FIG. 3 is a flowchart for illustrating a database creation method according to a second embodiment of the present invention. Portions that correspond to those shown in the former drawing are denoted by the same symbols as those used in the former drawings and the detailed explanation thereof is omitted (this applies to the other embodiments).

The present embodiment is an example that the evaluation value in step S2 (calculation of evaluation value of an unregistered cell) is an OPC verification value.

Step S2 includes step $S2_1$ of subjecting an unregistered cell to an OPC process and step $S2_2$ of calculating an OPC verification value of the unregistered cell subjected to the OPC process. In the OPC verification value calculation process, the cell shape after OPC is compared with the cell shape used as a reference and the difference therebetween is used as an OPC verification value.

In the case of the present embodiment, the OPC verification value is registered as an evaluation value (step S3).

In the database device corresponding to the database creation method of the present embodiment, an evaluation value calculation unit 2 for an unregistered cell performs an operation process corresponding to steps $S2_1$ and $S2_2$ and a database updating unit 3 registers an OPC verification value as an evaluation value.

Thus, the relation between the database creation method of the present embodiment and the database device corresponding thereto is clear, and therefore, the explanation of the database device corresponding to the database creation method of the embodiment is omitted in the following explanation.

Third Embodiment

Figure 4:
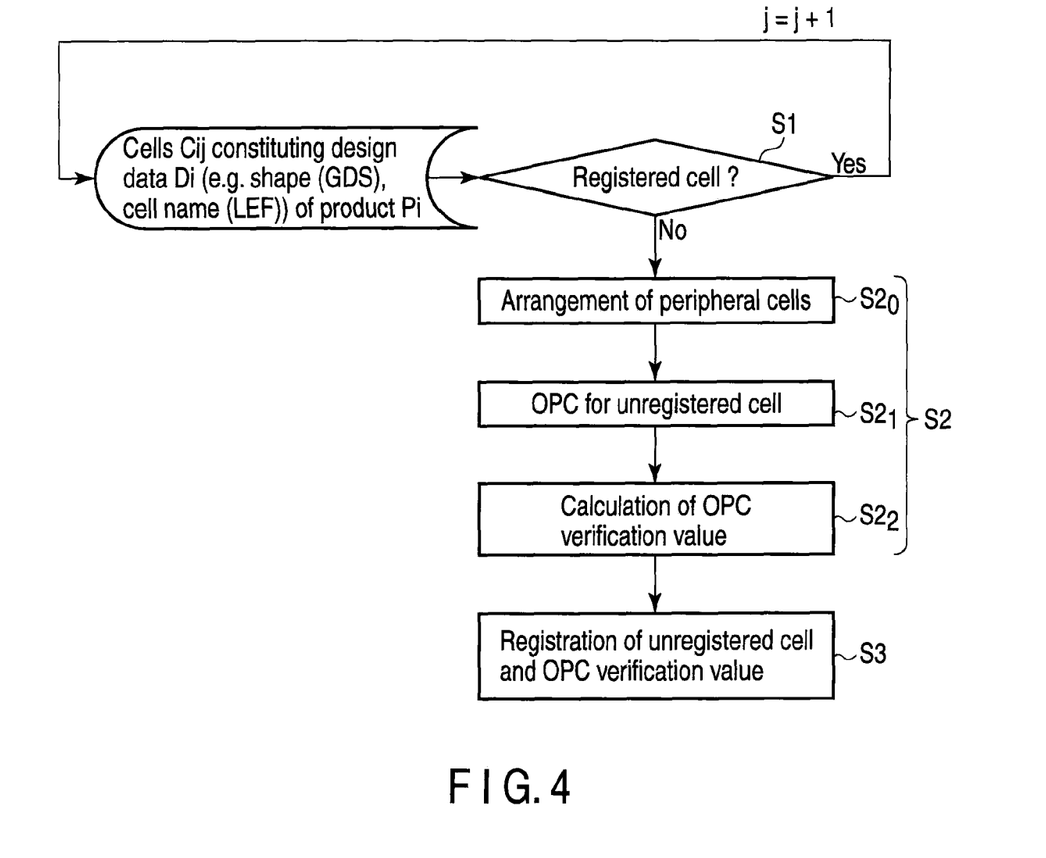
FIG. 4 is a flowchart for illustrating a database creation method according to a third embodiment of the present invention.

FIG. 4 is a flowchart for illustrating a database creation method according to a third embodiment of the present invention.

The present embodiment is different from the second embodiment in that cells (peripheral cells) are arranged around an unregistered cell (step $S2_0$), thereafter, steps $S2_1$ and $S2_2$ are performed by considering the unregistered cell and the peripheral cells as one unregistered cell.

According to the present embodiment, the reliability of data to be registered in the database is enhanced since the OPC verification value having higher precision is obtained by performing OPC which takes the influence of the peripheral cells into consideration.

Fourth Embodiment

Figure 5:
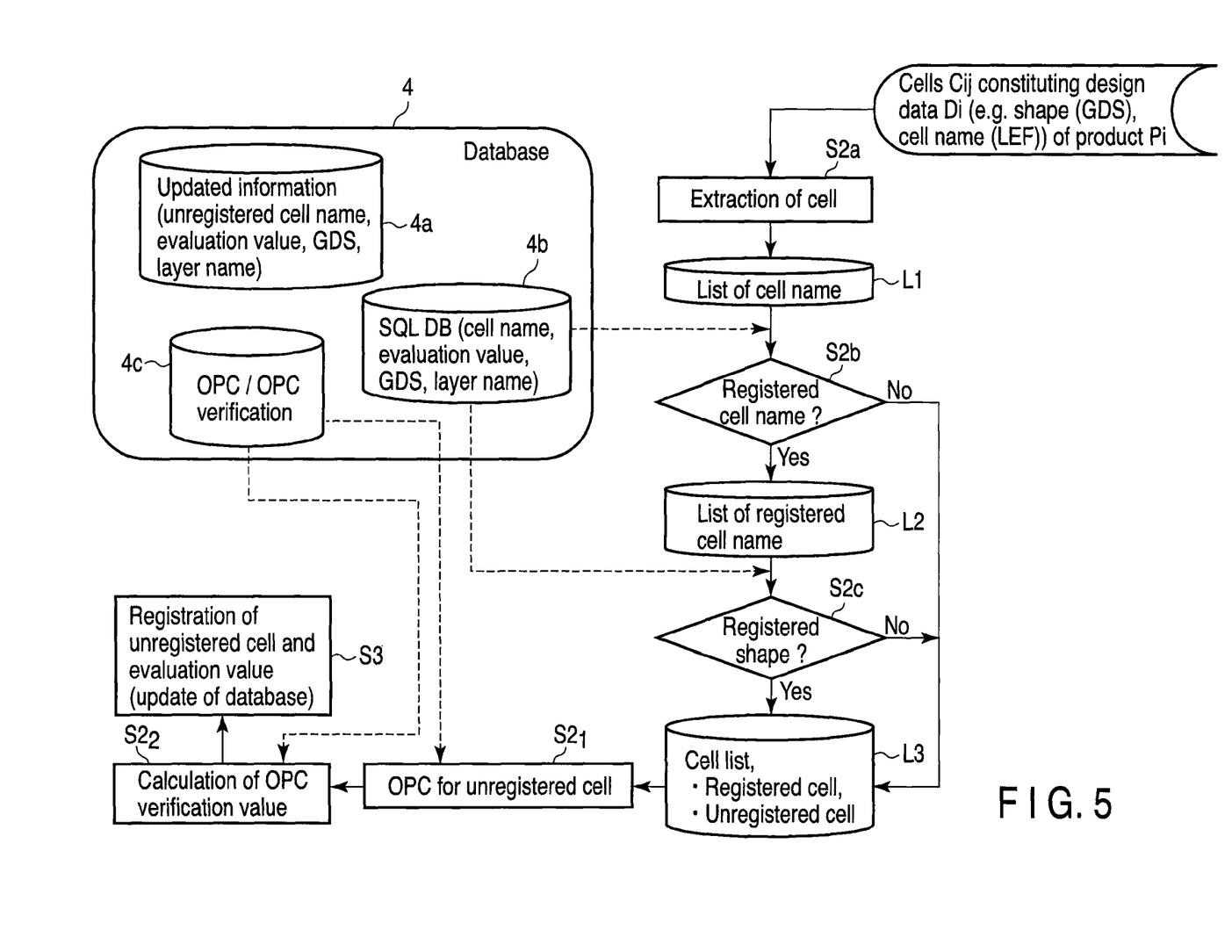
FIG. 5 is a flowchart for illustrating a database creation method according to a fourth embodiment of the present invention.

FIG. 5 is a flowchart for illustrating a database creation method according to a fourth embodiment of the present invention.

The present embodiment indicates an example in which data containing GDS and LEF is used as design data in the second embodiment. It is possible to include DEF (design-exchange format) in addition to GDS and LEF.

First, a plurality of cells Cij are extracted from design data Di of a semiconductor integrated circuit in a product Pi (step 2a) and then a list L1 of cell names of the cells Cij is formed.

The cell name is registered in LEF. DEF may be used together when the list L1 is formed. In this case, a cell that is forgotten to be registered can be detected by use of DEF. Therefore, all of the cells Cij can be described in list L1 without fail.

At first, cells Cij related to a first-layered pattern constituting the semiconductor integrated circuit are extracted. For example, the first-layered pattern is a pattern constituting MOS transistors on a substrate. After the steps S2b to S3, cells Cij related to a second-layered pattern constituting the semiconductor integrated circuit are extracted (step S2a) and steps S2b to S3 are performed. For example, the second-layered pattern is a pattern constituting plugs connected to the sources/drains of the MOS transistors. Thereafter, steps S2a to S3 are similarly performed for the remaining layer patterns.

Next, whether a cell name registered in list L1 is a cell name registered in an SQL database 4b or not is judged (step S2b) by referring to the SQL database 4b (cell names, layer names) in the database 4, and a list L2 of the cell names registered in the SQL database 4b is formed.

Next, by referring to the SQL database 4b (GDS), the shape of a pattern corresponding to the cell name registered in list L2 is judged whether it is registered in GDS registered in the SQL database 4b or not (step S2b), and if the shape is registered in the SQL database 4b, the registered cell is registered in a list L3.

On the other hand, the cell judged NO (unregistered cell) in steps S2b, S2c is also registered in list L3.

Thus, in the present embodiment, first, a cell whose cell name is not registered is judged as an unregistered cell and a cell whose shape is not registered is judged as an unregistered cell even if the cell name thereof is registered.

Next, an unregistered cell is extracted from cell list L3 and then steps $S2_1$, $S2_2$ are performed. At this time, an OPC program, OPC verification program required for steps $S2_1$, $S2_2$ are read from a database 4c of the database 4.

Next, step S3 is performed. An unregistered cell and OPC verification value are temporarily registered as updating information in the database 4a of the database 4. Thereafter, the updating information is transferred from the database 4a to the database 4b and treated as a registered cell.

Thereafter, steps S2a to S3 are performed for the remaining layer patterns as described above.

In addition, in step $S2_1$, a PPC may be performed instead of the OPC. In this case, OPC in step $S2_2$ and database 4c of FIG. 5 is read as PPC.

Fifth Embodiment

Figure 6:
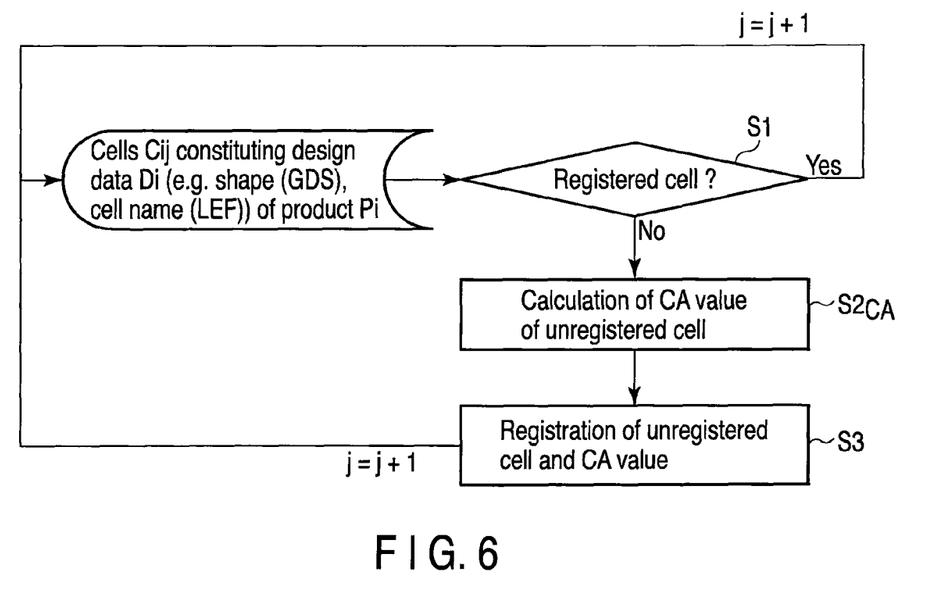
FIG. 6 is a flowchart for illustrating a database creation method according to a fifth embodiment of the present invention.

FIG. 6 is a flowchart for illustrating a database creation method according to a fifth embodiment of the present invention.

The present embodiment indicates an example in which the evaluation value in step S2 (calculation of evaluation value of unregistered cell) is a critical area (CA) value. In the case of the present embodiment, CA value is registered as the evaluation value (step S3). The critical area is an area in which a fatal defect such as an open defect or short defect between lines on the wafer occurs if particles (failures) are present.

Figure 7:
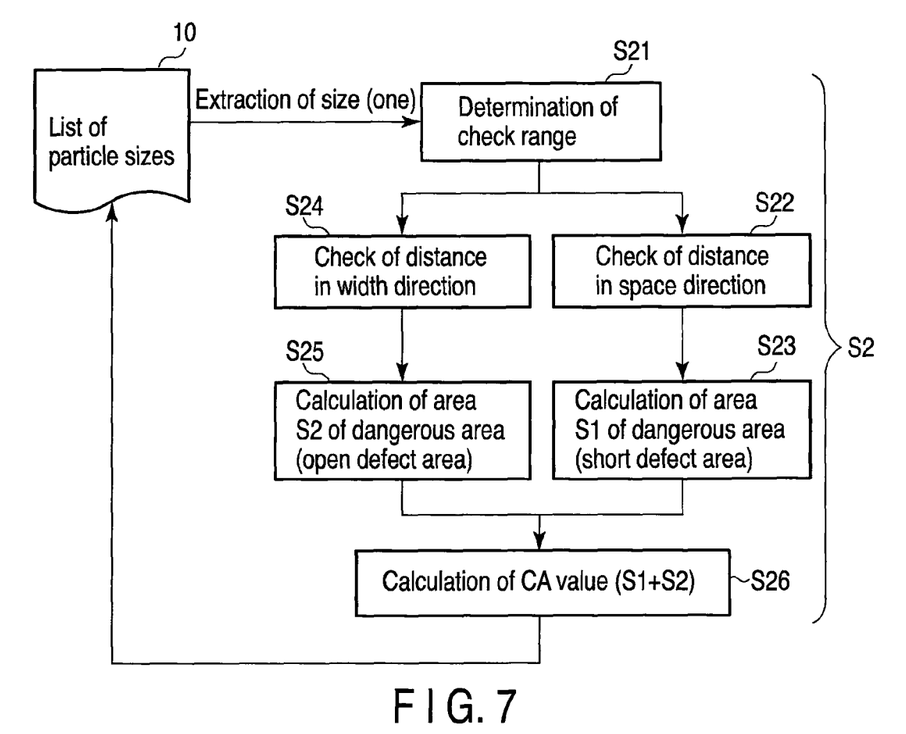
FIG. 7 is a flowchart for illustrating one example of a CA value calculation method.

FIG. 7 is a flowchart for illustrating an example of a CA value calculation method.

First, a check range is determined for one size extracted from a list 10 of particle sizes (step S21).

If the check range is too large for the particle size, there occurs a possibility that an area that is not necessarily checked will be checked. For example, when an area of preset size is provided and no pattern is present in the area, neither the open defect nor the short defect occurs even if particles are present in the area. It is useless to check the above area.

Here, it is supposed that a wiring pattern is used as the pattern, a square is set as the particle shape and a length of one side of the square is set as the particle size.

Figure 8A:
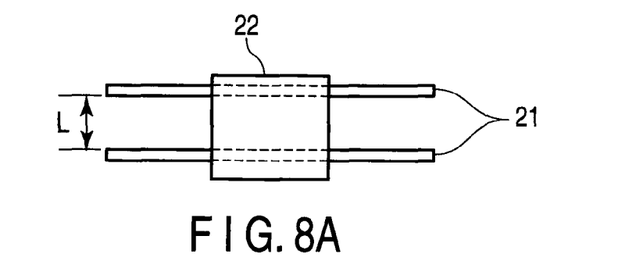
FIGS. 8A and 8B are diagrams showing examples of processing contents of steps S22 and S23 in the flowchart of FIG. 6.

Next, the distance between the wiring patterns in the space direction is checked (step S22). Specifically, as shown in FIG. 8A, an area (first dangerous area) in which the distance L between wiring patterns 21 in the space direction is not larger than the length of one side of a particle 22 is searched for. The first dangerous area is used as an area in which a short failure may occur.

Figure 8B:
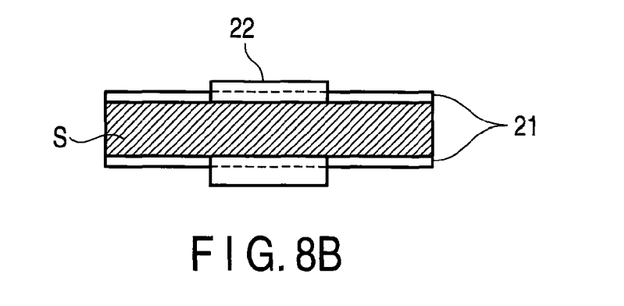

Next, the area S1 of the first dangerous area is calculated (step S23). Specifically, as shown in FIG. 8B, the product of the distance L and the length of the wiring pattern 21 becomes the area S1.

In steps S22 and S23, one first dangerous area lying in the check range is explained for simplicity, but in practice, a case wherein a plurality of first dangerous areas are present may occur. Further, a case wherein no first dangerous area is present may occur.

Likewise, the distance of the wiring pattern in the width direction is checked, an area (second dangerous area) in which an open defect occurs is searched for (step S24), and an area S2 of the second dangerous area is calculated (step S25). There may occur a case wherein a plurality of second dangerous areas are present or no second dangerous area is present.

Next, a CA value (=S1+S2) is calculated based on the areas S1 and S2. CA values are similarly calculated for the remaining sizes.

Here, the area S2 is calculated after the area Si is calculated, but the processes can be reversed or the calculation process of the area S1 and the calculation process of the area S2 may be performed in parallel and the areas S1 and S2 can be simultaneously calculated.

Sixth Embodiment

Figure 9:
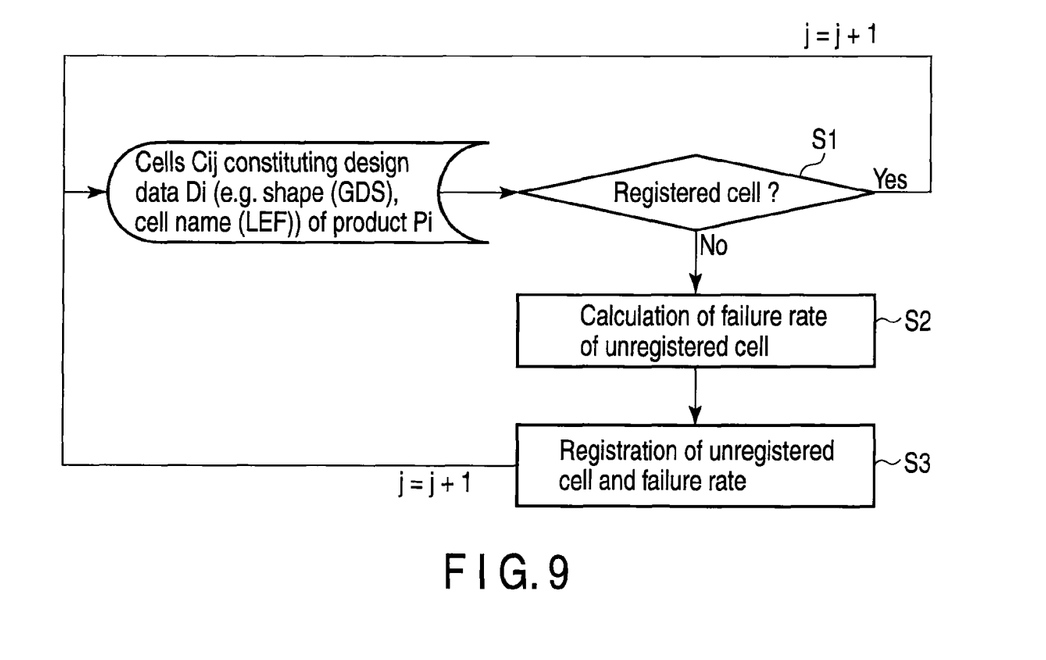
FIG. 9 is a flowchart for illustrating a database creation method according to a sixth embodiment of the present invention.

FIG. 9 is a flowchart for illustrating a database creation method according to a sixth embodiment of the present invention.

The present embodiment indicates an example in which the evaluation value obtained in step S2 (calculation of evaluation value of unregistered cell) is a failure rate which is a probability that a hot spot is contained in a pattern corresponding to an unregistered cell. In the case of the present embodiment, the failure rate is registered as the evaluation value (step S3). The hot spot is a portion that is difficult to be initially determined as a defect and is difficult to be determined as a defect if the pattern is not actually formed.

Figure 10:
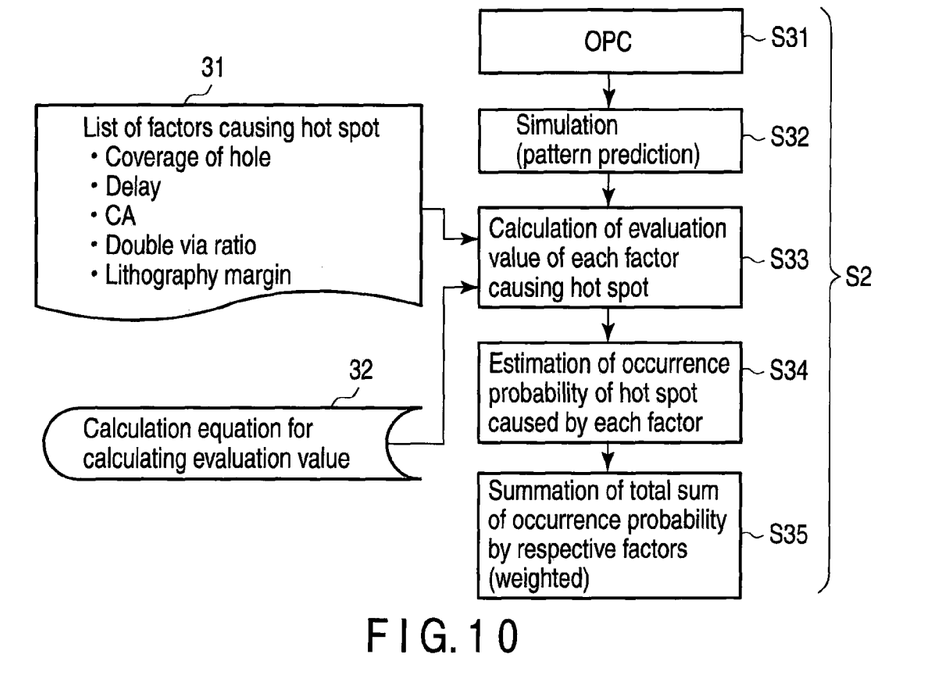
FIG. 10 is a flowchart for illustrating one example of a failure rate calculation method.

FIG. 10 is a flowchart for illustrating an example of the failure rate calculation method.

First, an OPC process is performed for an unregistered cell (step S31).

Next, a pattern on a wafer corresponding to the unregistered cell subjected to the OPC process is predicted by lithography simulation (step S32)

Next, evaluation values of factors that cause the hot spot are calculated for the predicted pattern by referring to a list 31 of the factors that cause the hot spot and a calculation equation 32 used to calculate the evaluation values of the factors (step S33).

The evaluation value of coverage of hole is how much the hole is covered with a conductive film which should cover the hole (coverage ratio), for example. The evaluation value of delay is a time from a signal is inputted into a cell until a signal is outputted from the cell (delay time), for example. The evaluation value of CA is a CA value. The evaluation value of a double-via ratio is a ratio of double via with respect to the whole via. A lithography margin is a depth of focus (DOF), for example.

Next, a occurrence probability of hot spot caused by the respective factors is estimated based on the evaluation values of the respective factors (step S34).

The occurrence probability of hot spot caused by the coverage of hole is estimated such that the occurrence probability of hot spot is to be higher as the coverage ration decreases, for example.

The occurrence probability of hot spot caused by the delay is estimated such that the occurrence probability is to be higher as the delay time increases, for example.

The occurrence probability of hot spot caused by the CA is estimated such that the occurrence probability is to be higher as the CA value increases, for example.

The occurrence probability of hot spot caused by the double-via ratio is estimated such that the occurrence probability of hot spot is to be higher as the double-via ratio decreases, for example.

The occurrence probability of hot spot caused by the lithography margin is estimated such that the occurrence probability of hot spot is to be higher as the DOF decreases, for example.

Then, the occurrence probabilities of hot spot caused by the respective factors are weighted, and the total sum of the weighted occurrence probabilities of hot spot caused by the respective factors is obtained (step S35). The total sum is used as the failure rate.

Seventh Embodiment

Figure 11:
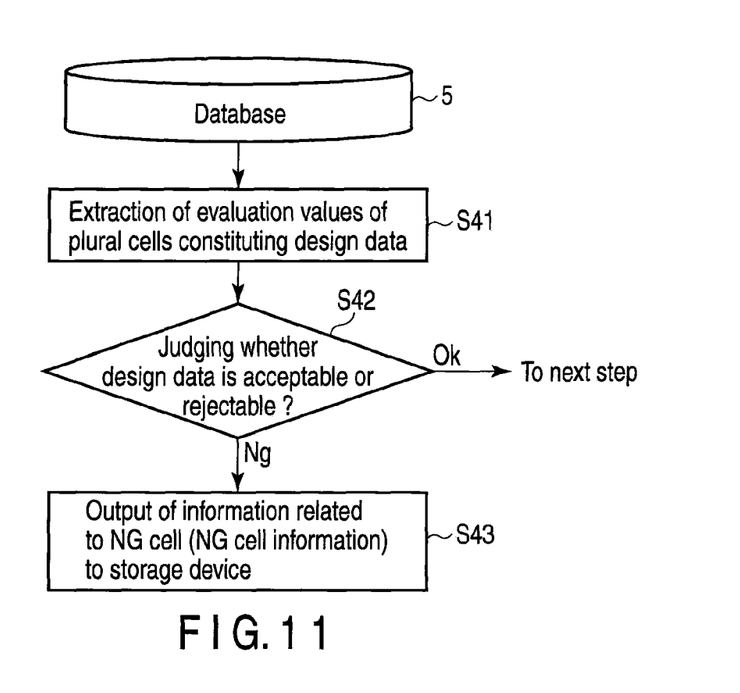
FIG. 11 is a flowchart for illustrating a design data evaluation method according to a seventh embodiment of the present invention.

FIG. 11 is a flowchart for illustrating a design data evaluation method according to a seventh embodiment of the present invention.

First, a plurality of evaluation values related to a plurality of cells constituting design data of a desired semiconductor integrated circuit are extracted from the database 4 formed by the database creation method of the above embodiment (step S41). In the database 4, a plurality of cells and a plurality of evaluation values corresponding thereto are registered for a plurality of semiconductor integrated circuits.

Next, whether the design data is acceptable or rejectable is judged based on the extracted evaluation values (step S42).

The above judgment of the design data is performed as follows for instance. That is, the design data is judged rejectable if even one of the evaluation values does not satisfy a criteria.

Figure 12:
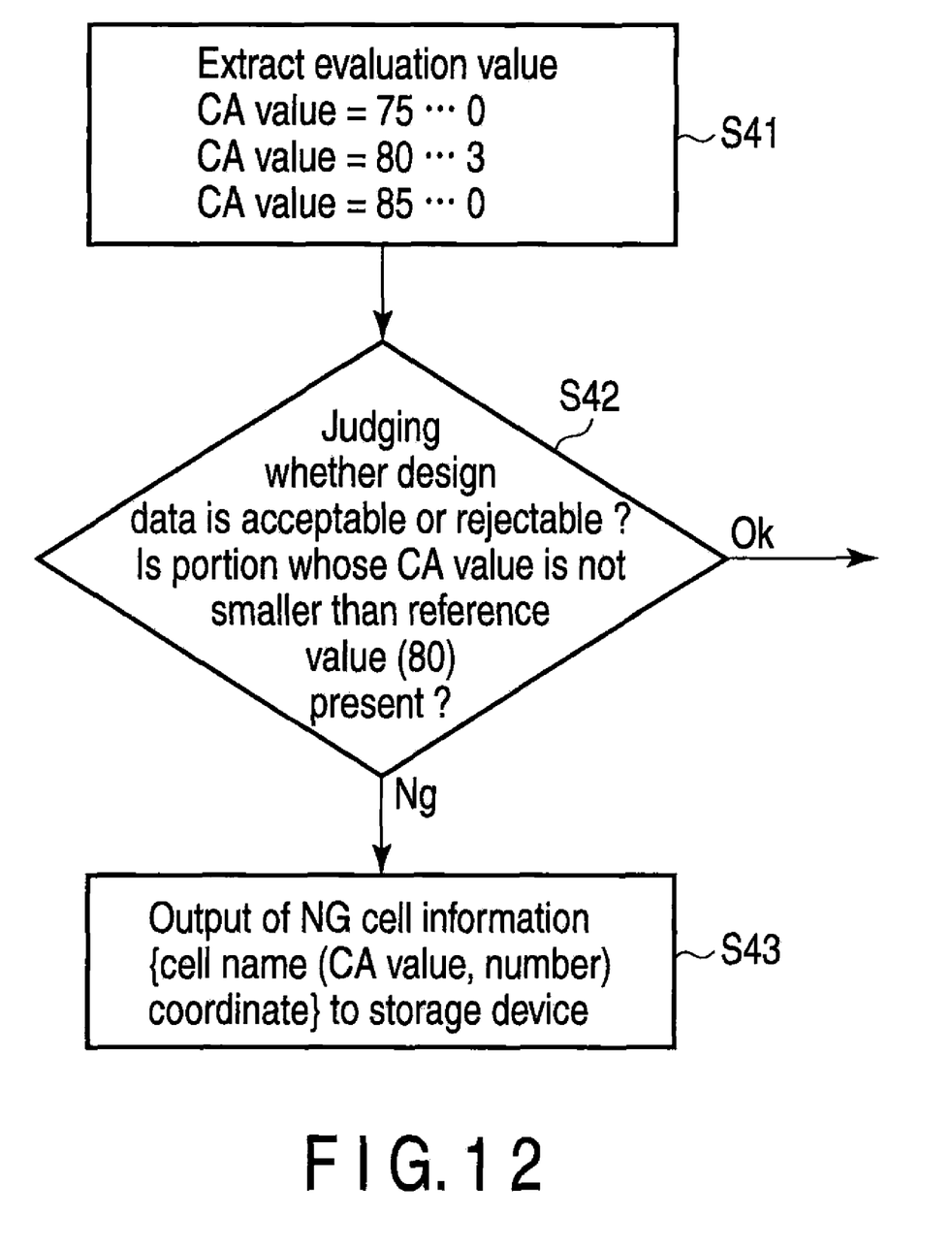
FIG. 12 is a diagram for illustrating one example of a process of determining whether design data is acceptable or rejectable.

For example, assume that the evaluation value is a CA value and the criteria is set that the CA value<80 is acceptable, then, as shown in FIG. 12, if an evaluation value of a certain cell is extracted, the number of portions of CA value=75 is 0, the number of portions of CA value=80 is 3 and the number of portions of CA value=85 is 0, then the design data is judged rejectable since portions of CA value≧80 are present.

In step S42, if the design data is judged acceptable (OK), the following step (step for manufacturing a mask based on the design data, etc.) is performed.

On the other hand, if the design data is judged rejectable (NG) in step S42, information related to the cell (NG cell) that does not satisfy the criteria (NG cell information) is output to an external storage device of the database 4 (step S43).

For example, if the evaluation value is the CA value, as shown in FIG. 12, the NG cell information contains the cell name of the NG cell, the CA value of an NG portion and coordinates of the NG portion. Further, the storage device is not particularly limited and a magnetic recording medium such as an HDD, a semiconductor memory, an optical recording medium such as a DVD or the like can be used.

Figure 13:
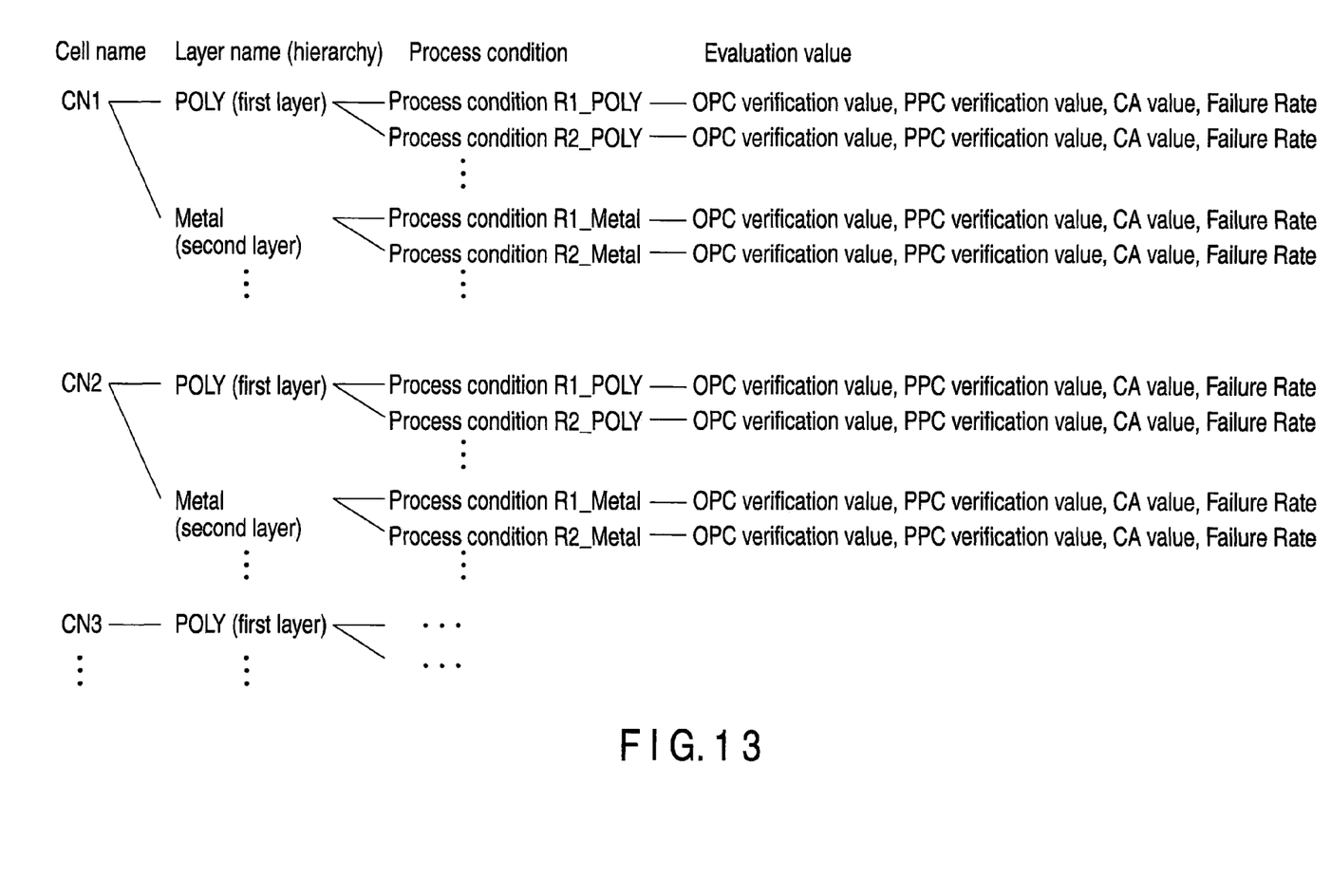
FIG. 13 is a diagram for illustrating an example of obtaining evaluation value for each of process conditions Rn (n=1, 2, . . . )

As described above, the first to seventh embodiments are explained. However, present invention is not limited to the above embodiments. For example, as shown in FIG. 13, evaluation values (OPC verification values, PPC verification values, CA values or failure rates) obtained for each process condition Rn_POLY, process condition Rn_Metal (n=1, 2, ... ) may be used as evaluation values in each of the cell names CNi (i=1, 2, ... ). The evaluation values obtained for each process condition Rn_POLY, process condition Rn_Metal are registered in the database. Therefore, the number of linkage between the cell names and evaluation values in the database is equal to the number of process conditions even in the same layer name (hierarchical layer) of the same cell name equal to the number of process conditions even in the same layer name (hierarchical layer) of the same cell name. A highly precise database can be constructed by taking the process conditions into consideration.

Figure 14:
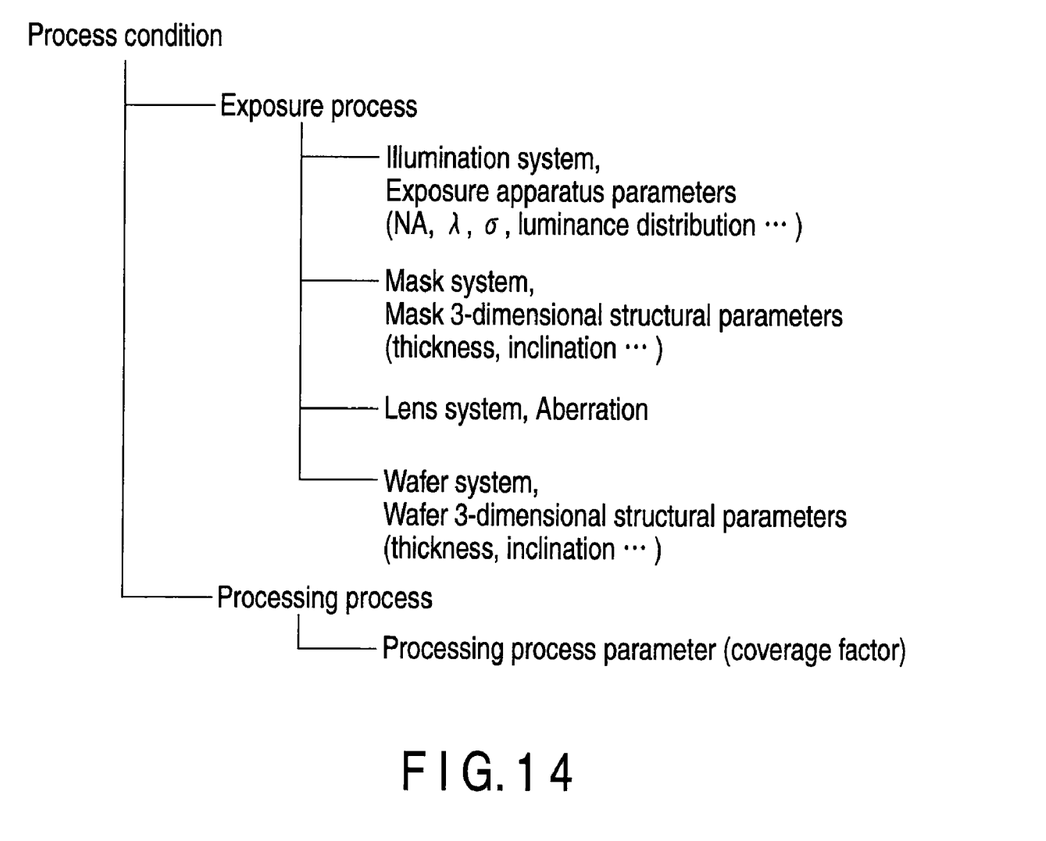
FIG. 14 is a diagram for illustrating an example of the process condition.

FIG. 14 shows an example of items of process condition. In the example of FIG. 14, the process conditions are roughly divided into conditions related to an exposure process and conditions related to a processing process.

The conditions related to the exposure process are conditions of an illumination system such as exposure apparatus parameters (for example, numerical aperture NA, wavelength λ, optical radius σ, luminance distribution [guard band]), conditions of a mask system such as 3-dimensional structural parameters of a mask (for example, thickness of the mask, inclination of the side surface of the mask [deviation from the vertical side surface (designed shape)]), conditions of a lens system such as aberration, and conditions of a wafer system such as 3-dimensional structural parameters of a wafer (for example, thickness of the wafer). The acquiring of evaluation value for each exposure apparatus may lead to creating a database for each exposure apparatus. On the other hand, the conditions related to the processing process are processing process parameters such as a resist coverage ratio.

Further, probability that a pattern corresponding to an unregistered cell includes a failure portion which lowers yield may be used as the evaluation value. In this case too, it may be obtained for each process condition.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented creation method for database relating to a plurality of semiconductor integrated circuits, the database registering, for the semiconductor integrated circuits, a plurality of function block cells constituting a design data of the corresponding semiconductor integrated circuit and a plurality of evaluation values corresponding to the plurality of function block cells, such that the plurality of function block cells are associated with the plurality of evaluation values, the creation method comprising:

judging, by a computer, whether a plurality of function block cells constituting design data of a desired semiconductor integrated circuit include an unregistered function block cell which is not registered in the database;

calculating, by a computer, an unregistered evaluation value corresponding to the unregistered function block cell when the plurality of function block cells include the unregistered function block cell, the unregistered evaluation value including verification values of optical proximity effect correction ("OPC") and process proximity correction ("PPC") for a pattern corresponding to the unregistered function block cell, a critical area value for a pattern corresponding to the unregistered function block cell, and a probability that hot spot or failure portion causing reduction of yield is included in a pattern corresponding to the unregistered function block cell, wherein:

the verification value of OPC or PPC corresponds to a difference between a cell shape after OPC or PPC and a reference cell shape, and the critical area value represents a size of an area in which a fatal defect occurs if particles are present; and updating, by a computer, the database by registering the unregistered function block cell and the unregistered evaluation value.

2. The creation method according to claim 1, wherein the evaluation value includes the verification values, the critical area value, and the probability for each of process conditions.

3. The creation method according to claim 1, wherein the plurality of function block cells are cells to perform a basic logical operation or cells to perform a predetermined logical function constructed by a plurality of basic logical operation.

4. The creation method according to claim 1, wherein the calculating the unregistered evaluation value includes arranging a plurality of function block cells around the unregistered cell function block cells, and the unregistered evaluation value is calculated by considering the unregistered cell and the plurality of function block cells arranged around the unregistered cell as one unregistered cell.

5. The creation method according to claim 1, wherein the design data includes a Graphic Database System (GDS) and a library-exchange format (LEF).

6. The creation method according to claim 5, wherein the design data further includes a design-exchange format (DEF).

7. A non-transitory computer-readable storage medium storing a set of instructions which, when executed by a processor, cause the processor to perform a method comprising:

accessing a database relating to a plurality of semiconductor integrated circuits, the database registering, for the semiconductor integrated circuits, a plurality of function block cells constituting design data of the corresponding semiconductor integrated circuit and a plurality of evaluation values corresponding to the plurality of function block cells, such that the plurality of function block cells are associated with the plurality of evaluation values;

judging whether a plurality of function block cells constituting design data of a desired semiconductor integrated circuit include an unregistered function block cell which is not registered in the database;

calculating an unregistered evaluation value corresponding to the unregistered function block cell when the plurality of function block cells include the unregistered function block cell, the unregistered evaluation value including verification values of optical proximity effect correction ("OPC") and process proximity correction ("PPC") for a pattern corresponding to the unregistered function block cell, a critical area value for a pattern corresponding to the unregistered function block cell, and a probability that hot spot or failure portion causing reduction of yield is included in a pattern corresponding to the unregistered function block cell, wherein:

the verification value of OPC or PPC corresponds to a difference between a cell shape after OPC or PPC and a reference cell shape, and the critical area value represents a size of an area in which a fatal defect occurs if particles are present; and updating the database by registering the unregistered function block cell and the unregistered evaluation value.

8. The storage medium according to claim 7, wherein calculating comprises arranging a plurality of function block cells around the unregistered cell function block cells, and calculating the unregistered evaluation value by considering the unregistered cell and the plurality of function block cells arranged around the unregistered cell as one unregistered cell.

9. A computer-implemented method for evaluating design data comprising:
  preparing, by a computer, a database relating to a plurality of semiconductor integrated circuits, the database registering, for the semiconductor integrated circuits, a plurality of function block cells constituting a design data of semiconductor integrated circuit and a plurality of evaluation values corresponding to the plurality of function block cells such that the plurality of function block cells are associated with the plurality of evaluation values, each of the evaluation values including verification values of optical proximity effect correction ("OPC") and process proximity correction ("PPC") for a pattern corresponding to the corresponding function block cell, a critical area value for a pattern corresponding to the corresponding function block cell, and a probability that hot spot or failure portion causing reduction of yield is included in a pattern corresponding to the corresponding function block cell, wherein:
  the verification value of OPC or PPC corresponds to a difference between a cell shape after OPC or PPC and a reference cell shape, and
  the critical area value represents a size of an area in which a fatal defect occurs if particles are present;
  extracting, by a computer, a plurality of evaluation values from the database, wherein the plurality of evaluation values are associated with a plurality of function block cells of a desired semiconductor integrated circuit in the plurality of semiconductor integrated circuits; and
  judging, by a computer, whether the design data of the desired semiconductor integrated circuit is acceptable or rejectable based on the extracted plurality of evaluation values.

10. The method according to claim 9, wherein:
  the design data of the desired semiconductor integrated circuit is judged rejectable when an evaluation value not satisfying a criteria is found in the plurality of evaluation values associated with the plurality of function block cells constituting the design data of the desired semiconductor integrated circuit, and
  the method further comprises outputting information including the function block cell not satisfying the criteria to a storage unit when the design data of the desired semiconductor integrated circuit is judged rejectable.

* * * * *